United States Patent
Lee

(10) Patent No.: US 6,713,363 B1
(45) Date of Patent: Mar. 30, 2004

(54) METHOD FOR FABRICATING CAPACITOR OF SEMICONDUCTOR DEVICE

(76) Inventor: Jun Sik Lee, Sungwoon APT., 102-805, 660-44, Yuiryang-dong, Sangdang-ku, Cheongju-si, Chungcheongbuk-do (KR)

( * ) Notice: Subject to any disclaimer, the term of this patent is extended or adjusted under 35 U.S.C. 154(b) by 0 days.

(21) Appl. No.: 09/722,583

(22) Filed: Nov. 28, 2000

(30) Foreign Application Priority Data

Aug. 17, 2000 (KR) ........................................ 2000-47542

(51) Int. Cl.⁷ .............................................. H01L 21/20

(52) U.S. Cl. ...................................................... 438/396

(58) Field of Search ............................ 438/3, 238, 239, 438/240, 241, 253, 396, 725; 430/311

(56) References Cited

U.S. PATENT DOCUMENTS

| | | | |
|---|---|---|---|
| 5,174,856 A | * 12/1992 | Hwang et al. ................... 134/1 |
| 5,200,031 A | * 4/1993 | Latchford et al. ............. 216/13 |
| 5,230,772 A | * 7/1993 | Kadomura .................... 216/47 |
| 5,780,115 A |   7/1998 | Park et al. |
| 5,872,061 A |   2/1999 | Lee et al. |
| 6,331,380 B1 | * 12/2001 | Ye et al. ...................... 430/311 |
| 6,372,150 B1 | * 4/2002 | Wong et al. ................... 216/13 |

FOREIGN PATENT DOCUMENTS

JP        61277129 A    * 12/1986    ............ H01J/9/227

* cited by examiner

Primary Examiner—W. David Coleman
Assistant Examiner—Brook Kebede
(74) Attorney, Agent, or Firm—Birch, Stewart, Kolasch & Birch, LLP

(57) ABSTRACT

A method for fabricating a capacitor of a semiconductor device is disclosed, in which loss of and damage to a lower electrode is minimized to improve process yield. The method for fabricating a capacitor of a semiconductor device includes, for example, forming a conductive region on a semiconductor substrate; forming an interleaving insulating a film having a contact hole on the conductive region; forming a contact plug within the contact hole; forming insulating film patterns on some region of the interleaving insulating film to expose the contact plug and the interleaving insulating film adjacent to the contact plug; depositing a barrier film and a first conductive layer on an entire surface including the contact plug and the insulating film patterns; forming a photoresist on an upper portion of the contact plug between the insulating film patterns; sequentially removing portions of the first conductive layer and the barrier film on the insulating film patterns using the photoresist as a mask to form a lower electrode and a barrier film in a U-shape in cross-section; removing the photoresist using an etching gas that is non-reactive with respect to the lower electrode; removing the insulating film patterns; and sequentially forming a dielectric film and an upper electrode on surface of the lower electrode and the barrier film.

8 Claims, 6 Drawing Sheets

METHOD FOR FABRICATING CAPACITOR OF SEMICONDUCTOR DEVICE

BACKGROUND OF THE INVENTION

1. Field of the Invention

The present invention relates to a device, and more particularly, to a method for fabricating a capacitor of a semiconductor device.

2. Background of Related Art

With the high packing density of a DRAM, an area of a chip has been reduced and areas of a transistor and a capacitor have been also reduced. At this time, the capacitor includes a high dielectric film to increase capacitance in a small area. $Ta_2O_5$ or $BST(Ba_xSr_{1-x}T_1O)$ maybe used as the high dielectric film. To use the high dielectric film in the capacitor, a lower electrode resistant to oxidation and heat is required. Oxide-based materials, such as platinum(Pt), iridium(Ir), and ruthenium(Ru), may be used as the lower electrode. Among the materials, Ru or $RuO_2$, which can be deposited by chemical vapor deposition and can be easily etched to form a capacitor structure, is especially used as the material for the lower electrode. During an etching process to form the capacitor structure, the lower electrode is etched to form a concave structure to the effective area of the capacitor in a given area. To form such a concave structure, Pt may be used but has a drawback in that it is more expensive than Ru during chemical vapor deposition.

A related art method for fabricating a capacitor using Ru, $RuO_2$, or a metal material alloyed with Ru as a lower electrode will now be described with reference to the accompanying drawings.

FIGS. 1A to 1E are sectional views showing a related art method for fabricating a capacitor of a semiconductor device.

A gate oxide film and a gate electrode are sequentially formed on some region of a semiconductor substrate 10, and source and drain regions are formed in the semiconductor substrate 10 at both sides of the gate electrode (not shown).

As shown in FIG. 1A an interleaving insulating film 11 is formed on the source region or the drain region to have a contact hole.

A polysilicon layer is then deposited on the interleaving insulating film 11 including the contact hole. A contact plug 12 is formed within the contact hole by polishing back the polysilicon layer.

Afterwards, a nitride film 13 is deposited on an entire surface including the contact plug 12, and an oxide film 14 is deposited on the nitride film 13.

As shown in FIG. 1B, the oxide film 14 and the nitride film 13 are sequentially etched by photolithography process to expose the contact plug 12 and the interleaving insulating film 11 adjacent to the contact plug 12.

As shown in FIG. 1C, a barrier film 15 is deposited on the contact plug 12 and the interleaving insulating film 11 including the oxide film 14 and the nitride film 13 to have a thickness of about 200 A. A conductive layer 16 is then deposited on the barrier film 15 to have a thickness of about 200 A.

The conducive layer 16 is formed of Ru, $RuO_2$, or a metal material alloyed with Ru. The barrier film 15 may be formed on only the contact plug 12 within the contact hole.

Afterwards, a photoresist 17 is deposited on the entire surface including the conductive layer 16 between the respective oxide films 14. The photoresist 17 is then etched back to expose sides of the conductive layer 16 between the respective oxide films 14 and an upper portion of the conductive layer 16 on the oxide film 14.

The conductive layer 16 on the oxide film 14 and the barrier film 15 are sequentially removed using the photoresist 17 as a mask, so that a pair of U-shaped barrier film 15 and lower electrode 16a are formed, as shown in FIG. 1D, to be isolated from another pair of U-shaped barrier film 15 and lower electrode 16a.

As described above, cells are separated from one another by isolating the lower electrodes 16a from one another.

The lower electrodes 16a are etched by $Ar+Cl_2$ plasma gas.

The photoresist 17 is then removed using $O_2$ plasma gas.

At this time, Ru or $RuO_2$ of the lower electrode 16a reacts with $O_2$ gas so that a volatile gas of $RuO_4$ is generated. For this reason, the lower electrodes 16a may be damaged.

Next, as shown in FIGS. 1A to 1E, the oxide film 14 and the nitride film 13 between the respective lower electrodes 16a are sequentially removed and a high dielectric film 18 and a conductive layer are sequentially formed on the entire surface including the lower electrodes 16a. The conductive layer and the high dielectric film 18 are partially removed to isolate a pair of the conductive layer and high dielectric film from a neighboring pair of the conductive layer and high dielectric film. Thus, a U-shaped capacitor which includes an upper electrode 19, the high dielectric film 18 and the lower electrode 16a is completed.

The aforementioned related art method for fabricating a capacitor of a semiconductor device has several problems.

When the photoresist used as a mask to form the lower electrode of Ru or $RuO_2$ in a U-shape is removed by $O_2$ plasma gas, $O_2$ gas chemically reacts with the lower electrode. As a result, the lower electrode is damaged, thereby reducing process yield.

SUMMARY OF THE INVENTION

Accordingly, the present invention is directed to a method for fabricating a capacitor of a semiconductor device that substantially obviates one or more of the problems occurring in the related art.

An object of the present invention is to provide a method for fabricating a capacitor of a semiconductor device in which loss of a lower electrode is minimized so as to improve process yield.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

To achieve these and other advantages and in accordance with the purpose of the present invention, as embodied and broadly described, a method for fabricating a capacitor of a semiconductor device includes: forming a conductive region on a region of a semiconductor substrate; forming an interleaving insulating film having a contact hole in the conductive region; forming a contact plug within the contact hole; forming insulating film patterns on a region of the interleaving insulating film to expose the contact plug and the interleaving insulating film adjacent to the contact plug; depositing a barrier film and a first conductive layer on an entire surface including the contact plug and the insulating film patterns; forming a photoresist on an upper portion of the contact plug between the insulating film patterns, sequentially removing the first conductive layer and the barrier film on the insulating film patterns using the photoresist as a mask to form a lower electrode and a barrier film in a U-shape; removing the photoresist using a non-reactive etching method; removing the insulating film pattern; and sequentially forming a dielectric film and an upper electrode on surfaces of the lower electrode and the barrier film.

It is to be understood that both the foregoing general description and the following detailed description are exemplary and explanatory and are intended to provide further explanation of the invention as claimed.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Reference will now be made in detail to the preferred embodiments of the present invention, examples of which are illustrated in the accompanying drawings.

FIGS. 2a to 2e are sectional views of process steps showing a method fabricating a capacitor of a semiconductor device according to the present invention.

The method for fabricating a capacitor of a semiconductor device according to the present invention is performed in such a manner that a conductive layer is deposited on a semiconductor substrate 110. A photoresist pattern is then formed on the conductive layer, and the conductive layer is etched using the photoresist as a mask to form a lower electrode. The photoresist is then removed using an etching gas having no volatility with respect to the lower electrode, and a dielectric film and an upper electrode are thereafter sequentially formed on a surface of the lower electrode.

In other words, the lower electrode of Ru, $RuO_2$, or a metal material alloyed with Ru is removed using the photoresist as a mask, and then the photoresist is removed using the etching gas having no volatility when reacting with the lower electrode.

One of $H_2O$, $NH_3$, and $N_2$ may be used as the etching gas. Alternatively, a gas mixture of $H_2$ and $O_2$ in which an amount of $H_2$ is smaller than an amount of $O_2$, may be used as the etching gas. Further, a mixing gas of $H_2O$, $NH_3$, and $N_2$, a gas of $N_2$ and a gas mixture of $NH_3$ and $H_2O$, or a gas mixture of $N_2$ and $H_2O$ may be used as the etching gas.

The aforementioned method for fabricating a capacitor of a semiconductor device according to the present invention will be described below in more detail.

A gate oxide film and a gate electrode are sequentially formed on a region of a semiconductor substrate 110, and source and drain regions are formed in the semiconductor substrate 110 at both sides of the gate electrode (not shown).

Figure 1A:
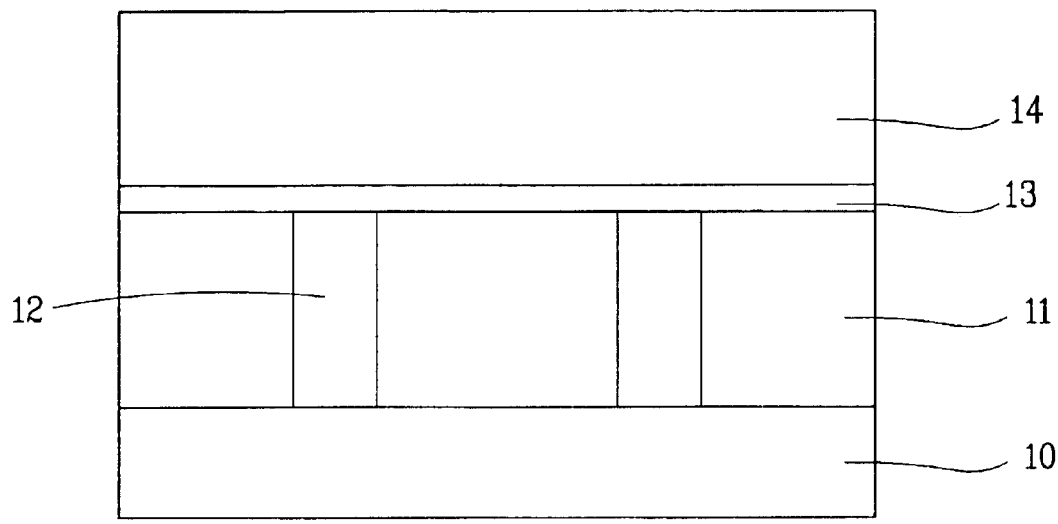
FIGS. 1A to 1E are sectional views of process steps showing a related art method for fabricating a capacitor of a semiconductor device.
Figure 1B:
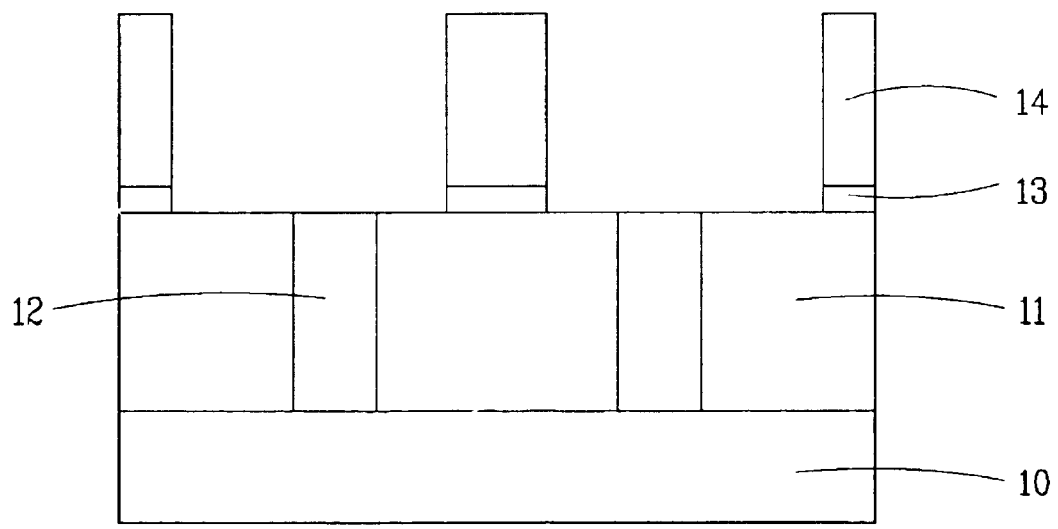
Figure 1C:
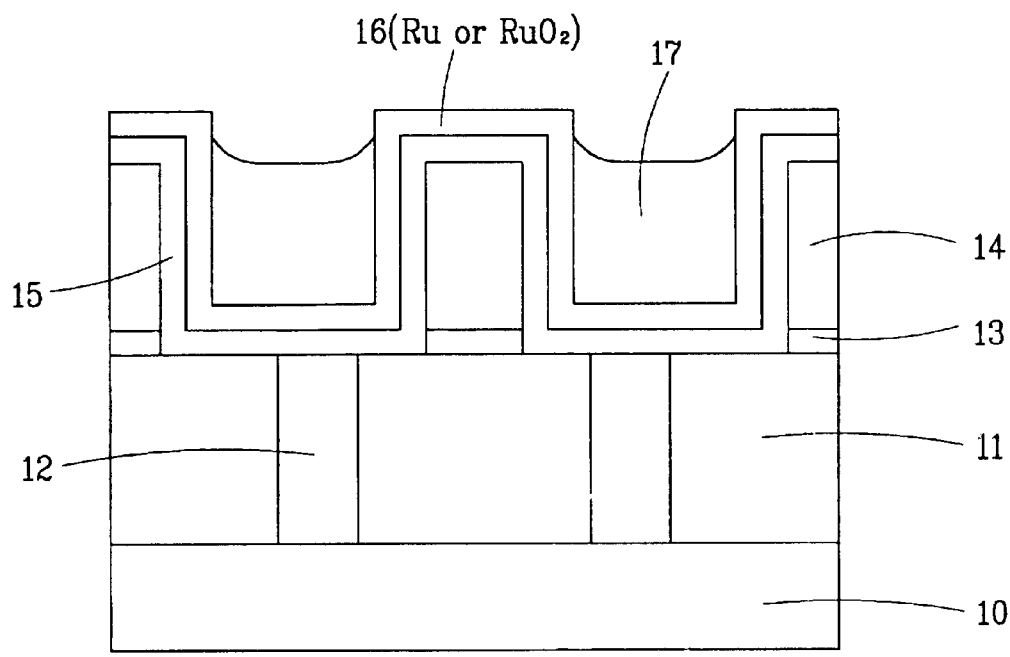
Figure 1D:
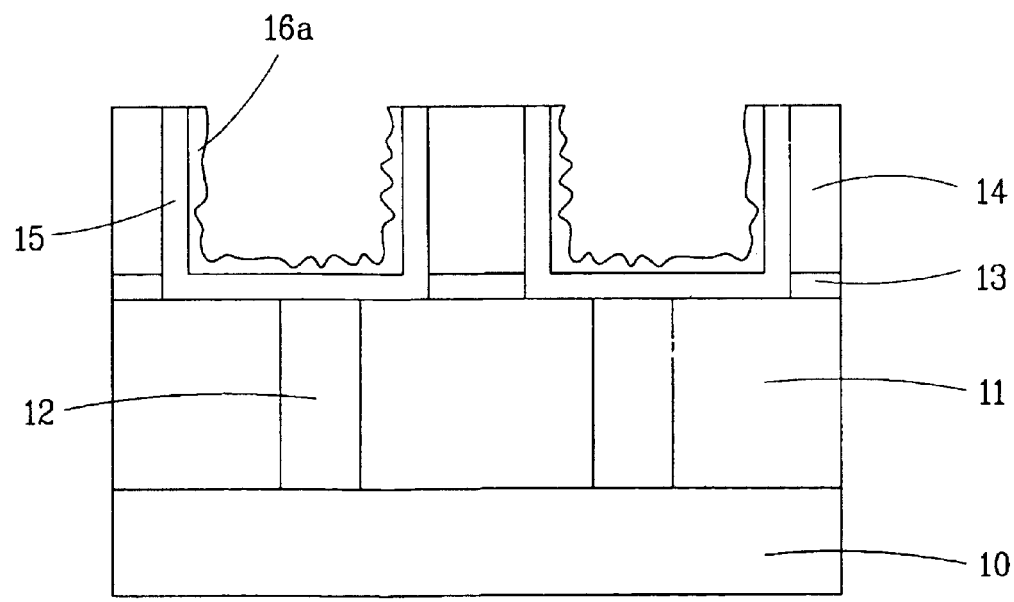
Figure 1E:
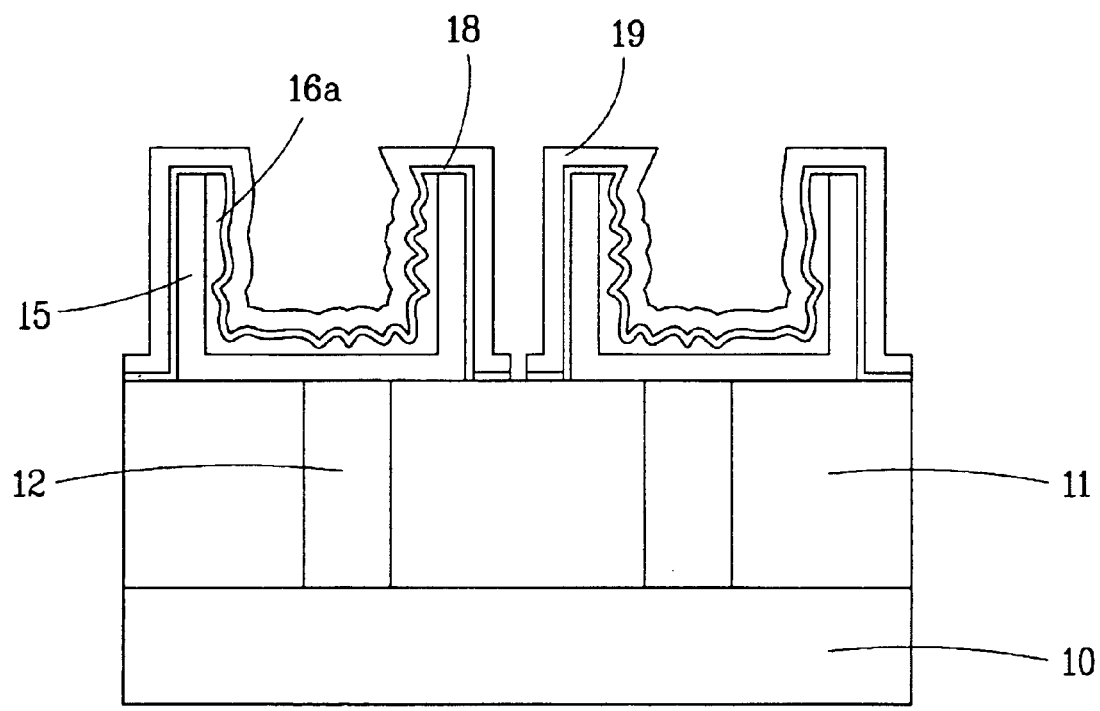
Figure 2A:
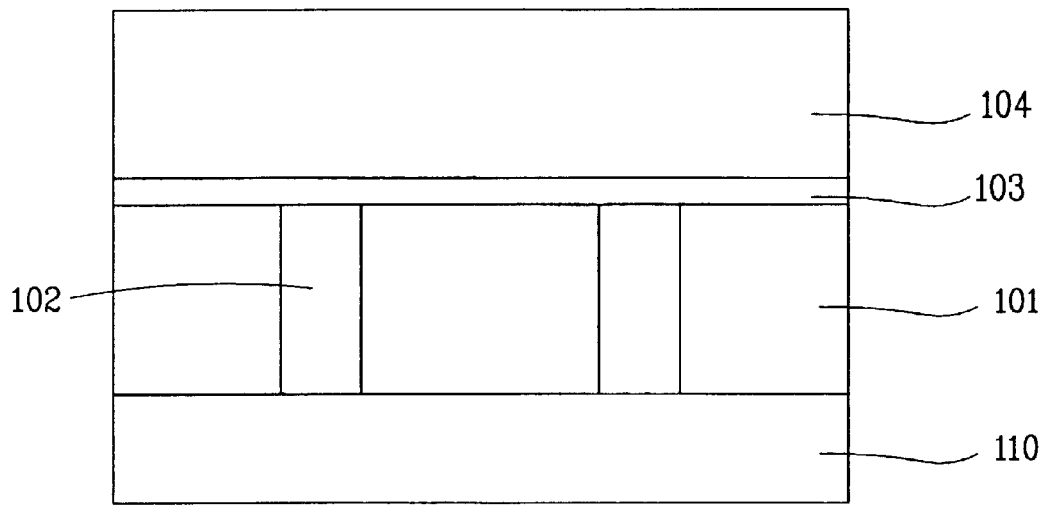
FIGS. 2A to 2E are sectional views of process steps showing a method for fabricating a capacitor of a semiconductor device according to the present invention.

Next, as shown in FIG. 2A, an interleaving insulating film 101 is formed over the source region or the drain region with a contact hole formed therein.

A conductive material such as polysilicon or tungsten, or another conductive material having low resistance is then deposited on the interleaving insulating film 101 including in the contact hole. A contact plug 102 is formed within the contact hole by an etch-back process or a chemical mechanical polishing process so that the conductive material is only formed within the contact hole.

Afterwards, a nitride film 103 is deposited on interleaving insulating film 101 including the contact plug 102, and an oxide film 104 is deposited on the nitride film 103 by, for example, chemical vapor deposition. The nitride film 103 has a thickness of about 500 A.

A photoresist (not shown) is deposited on the oxide film 104 and then selectively patterned by exposure and developing processes, so that the photoresist over the contact plug 102 and the interleaving insulating film 101 adjacent to the contact plug 102 is removed.

Figure 2B:
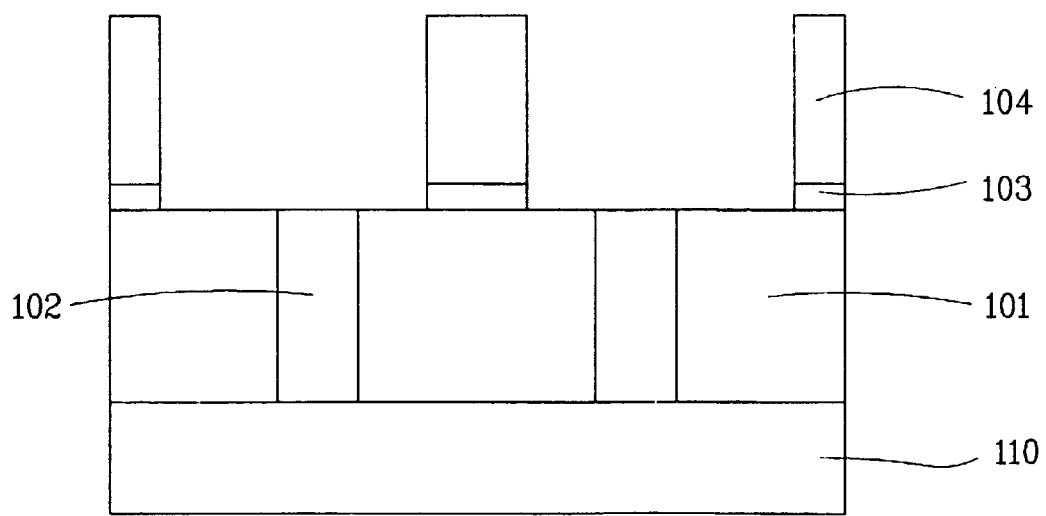

The oxide film 104 and the nitride film 103 are sequentially etched as seen in FIG. 2B using the patterned photoresist as a mask so as to expose the contact plug 102 and the interleaving insulating film 101 adjacent to the contact plug 102.

Figure 2C:
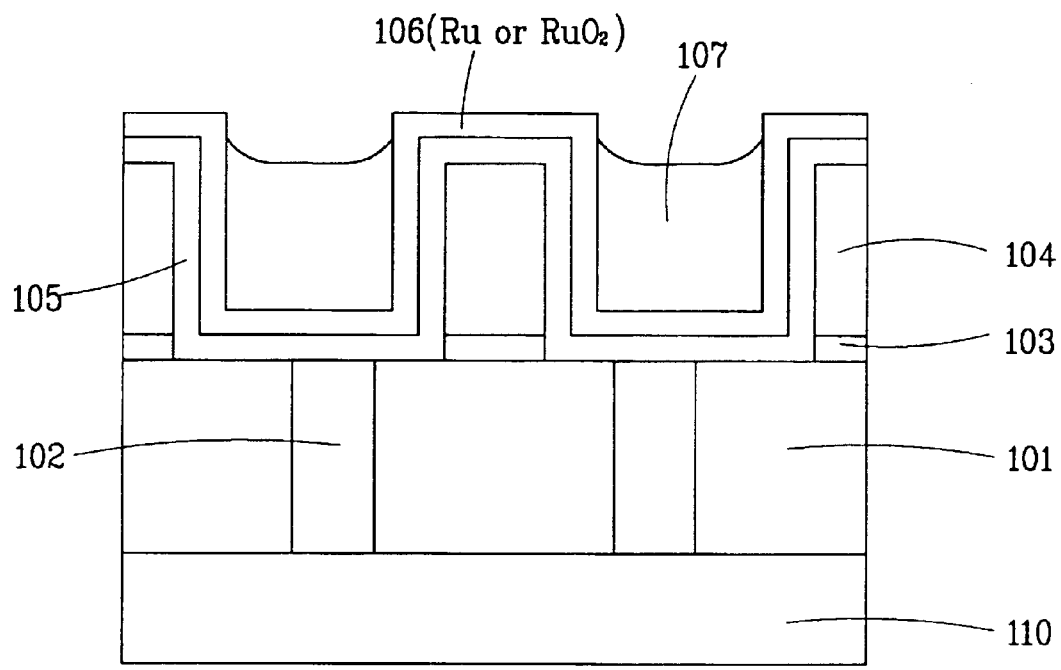

As shown in FIG. 2C, a barrier film 105 and a conductive layer 106 are sequentially deposited over the contact plug 102 and the interleaving insulating film 101 including the oxide film 104 and the nitride film 103 to have a thickness of about 200 A.

At this time, the barrier film 105 acts to closely adhere the conductive layer 106 and the oxide film 104 to each other, and alternatively may be formed on only the contact plug 102 within the contact hole. The conductive layer is formed of Ru, $RuO_2$, or a metal material alloyed with Ru.

Afterwards, a photoresist 107 is deposited on the resultant surface including the conductive layer 106 between the respective oxide films 104. The photoresist 107 is then etched back to expose sides of the conductive layer 106 between the respective oxide films 104 and an upper portion of the conductive layer 106 on the oxide film 104. See FIG. 2C.

Figure 2D:
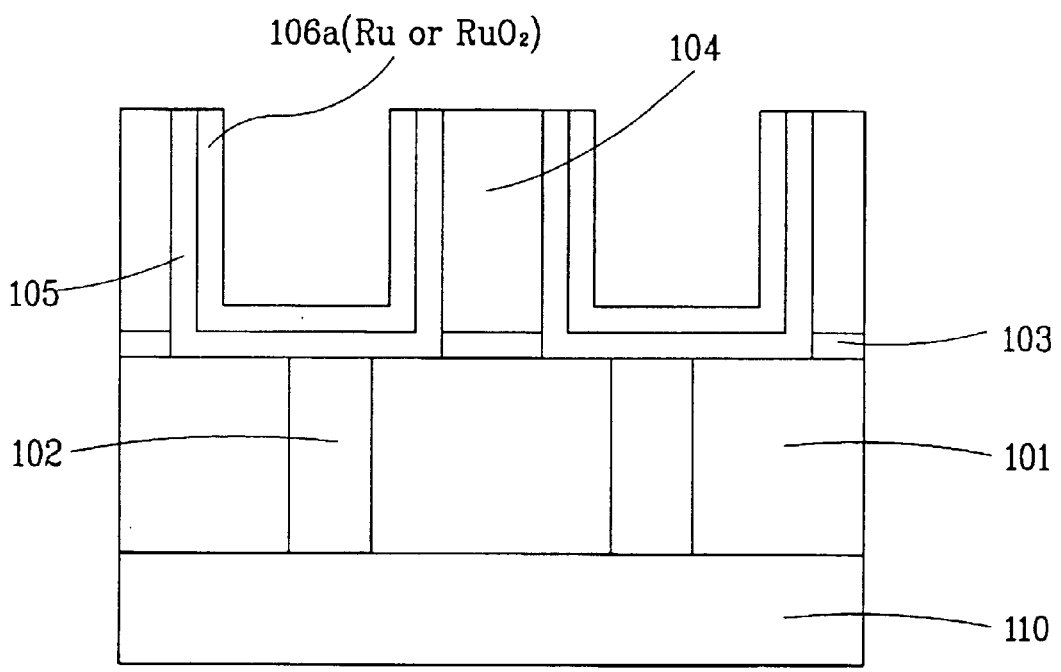

Portions of the conductive layer 106 and the barrier film 105 are sequentially removed using the etched back photoresist 107 as a mask to expose the upper portion of the oxide film 104, so that U-shaped (as seen in cross-section) barrier films 105 and lower electrodes 106a isolated from another U-shaped barrier films 105 and lower electrodes 106a are formed as shown in FIG. 2D.

As described above, cells are separated from one another by isolating the lower electrodes 106a from one another. The lower electrodes 106a are etched by, for example, $Ar+Cl_2$ plasma gas.

The photoresist 107 is then removed using an etching gas that does not react with the metal material of the lower electrode 106a. One of $H_2O$, $NH_3$, and $N_2$ may be used as the etching gas. Alternatively, a gas mixture of $H_2$ and $O_2$ in which an amount of $H_2$ is smaller than an amount of $O_2$, may be used as the etching gas. Also, a mixture of $H_2O$, $NH_3$, and $N_2$, a mixture of $N_2$ and $NH_3$, a mixture of $NH_3$ and $H_2O$, or a mixture of $N_2$ and $H_2O$ may be used as the etching gas.

Figure 2E:
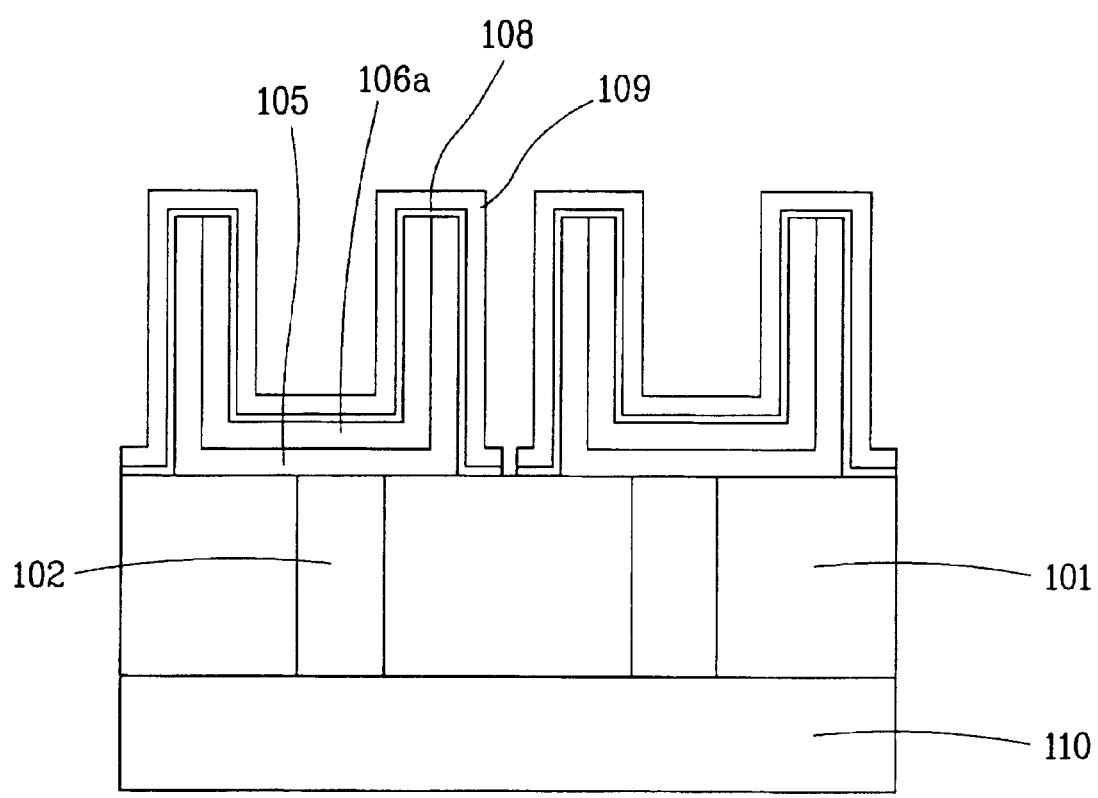

Next, as shown in FIG. 2E, the oxide film 104 and the nitride film 103 between the respective lower electrodes 106a are removed, and a high dielectric film 108 and a conductive layer are sequentially formed on the resultant surface including the lower electrodes 106a. Portions of the conductive layer and the high dielectric film 108 are removed to electrically isolate a respective conductive layer high dielectric film unit from a neighboring conductive layer/high dielectric film unit. Thus, the high dielectric film 108 and an upper electrode 109 are sequentially formed.

Specifically, as seen in FIG. 2E, after the conductive layer is formed of Ru, $RuO_2$, or a metal material alloyed with Ru, the photoresist is deposited to form the upper electrodes 109 isolated from one another and then selectively patterned. The conductive layer is removed using the patterned photoresist as a mask to form the upper electrode 109 isolated from one another. The patterned photoresist is removed using the same etching gas of the lower electrode 106a. Thus, a capacitor which includes the upper electrode 109, the high dielectric film 108 and the lower electrode 106a is completed.

As aforementioned, the method for fabricating a capacitor of a semiconductor substrate according to the present invention has the following advantages.

Since the photoresist used as a mask to etch the lower electrode of Ru, $RuO_2$ or a metal material alloyed with Ru is removed using an etching gas that does not react with the lower electrode, the lower electrode is prevented from being damaged, thereby improving process yield.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications and variations will be apparent to those skilled in the art. In the claims, means-plus-function clause are intended to cover the structures described herein as performing the recited function and not only structural equivalents but also equivalent structures.

What is claimed is:

1. A Method for fabricating a capacitor of a semiconductor device comprising:

depositing a nitride film and an oxide film over a substrate, the oxide film being deposited on the nitride film by chemical vapor deposition;

sequentially etching the oxide film and the nitride film using a patterned photoresist as a mask;

depositing a conductive layer over the substrate;

forming a photoresist pattern on the conductive layer;

etching the conductive layer using the photoresist pattern as a mask to form a lower electrode;

removing the photoresist using an etching gas that is non-reactive with respective to the lower electrode, wherein the etching gas is one of a mixture $H_2O$, $NH_3$, and $N_2$, a mixture of $N_2$ and $NH_3$, a mixture of $NH_3$ and $H_2O$, and a mixture of $N_2$ and $H_2O$; and forming a dielectric film and an upper electrode on a surface of the lower electrode.

2. The method of claim 1, wherein the upper and lower electrodes are one of Ru, $RuO_2$ and a metal material alloyed with Ru.

3. A method for fabricating a capacitor of a semiconductor device comprising:

forming a conductive region on a semiconductor substrate;

forming an interleaving insulating film having a contact hole therein over the conductive region;

forming a contact plug within the contact hole;

forming insulating film patterns on the interleaving insulating film to expose the contact plug and the interleaving insulating film adjacent to the contact plug;

depositing a barrier film and a first conductive layer on the contact plug and the insulating film patterns;

forming a photoresist over the contact plug between the insulating film patterns;

sequentially removing the first conductive layer and the barrier film on the insulating film patterns using the photoresist as a mask, thereby forming a lower electrode and a barrier film in a U-shape in cross-section;

removing the photoresist using an etching gas that is non-reactive with respective to the lower electrode, wherein the etching gas is one of a mixture $H_2O$, $NH_3$, and $N_3$, a mixture of $N_2$ and $NH_3$, a mixture of $NH_3$ and $H_2O$, and a mixture of $N_2$ and $H_2O$;

removing the insulating film patterns; and sequentially forming a dielectric film and an upper electrode on the lower electrode and the barrier film.

4. The method of claim 3, wherein the lower electrode is one of Ru, $RuO_2$ and a metal material alloyed with Ru.

5. The method of claim 3, wherein the insulating film patterns comprise an oxide film.

6. The method of claim 3, wherein the insulating film patterns are formed by stacking two insulating films.

7. The method of claim 6, wherein the two insulating films are a nitride film and an oxide film.

8. The method of claim 3, wherein the barrier film is only formed on the contact plug within the contact hole.

* * * * *